United States Patent [19]

Pollock

[11] Patent Number: 4,641,048
[45] Date of Patent: Feb. 3, 1987

[54] DIGITAL INTEGRATED CIRCUIT PROPAGATION DELAY TIME CONTROLLER

[75] Inventor: Ira G. Pollock, Beaverton, Oreg.

[73] Assignee: Tektronix, Inc., Beaverton, Oreg.

[21] Appl. No.: 643,940

[22] Filed: Aug. 24, 1984

[51] Int. Cl.[4] .............................................. H03K 5/26
[52] U.S. Cl. ...................................... 307/591; 307/443; 307/455; 307/480; 307/526; 307/595; 307/597; 307/608; 328/128
[58] Field of Search ............... 307/590, 591, 595, 597, 307/603, 608, 262, 269, 601, 581, 443, 455, 467, 480, 526; 328/128

[56] References Cited

U.S. PATENT DOCUMENTS

| | | | |
|---|---|---|---|
| 3,783,393 | 1/1974 | Kakiura | 328/128 X |
| 3,996,481 | 12/1976 | Chu et al. | 307/481 |
| 4,286,223 | 8/1981 | Shearer | 307/526 X |
| 4,346,343 | 8/1982 | Berndlmaier et al. | 307/591 X |
| 4,365,207 | 12/1982 | Fukuchi | 328/128 X |
| 4,494,021 | 1/1985 | Bell et al. | 307/601 |
| 4,514,647 | 4/1985 | Shoji | 307/603 |

Primary Examiner—Stanley D. Miller
Assistant Examiner—D. R. Hudspeth
Attorney, Agent, or Firm—Francis I. Gray; John P. Dellett

[57] ABSTRACT

A propagation delay time controller comprises a phase locked ring oscillator and a bias signal generator for controlling the propagation delay time of logic elements on an integrated circuit. The logic elements are of a type in which propagation delay time is a function of an applied bias signal. The ring oscillator, comprising representative logic elements on the controlled integrated circuit, oscillates with a frequency dependent on the propagation delay time of the oscillator logic elements. The bias signal generator compares the oscillator output voltage with a known, pulsed reference signal and generates a bias signal proportional to the integral of the phase difference between the oscillator and reference signal pulses. The bias signal is applied to all logic elements in the ring oscillator and to all other logic elements on the integrated circuit to be controlled. The bias signal thus holds propagation delay time in each controlled logic element to a value fixed by the frequency of the reference signal.

5 Claims, 4 Drawing Figures

DIGITAL INTEGRATED CIRCUIT PROPAGATION DELAY TIME CONTROLLER

BACKGROUND OF THE INVENTION

The present invention relates to digital integrated circuits in general, and in particular to a circuit for controlling the signal propagation delay time of logic elements on an integrated circuit (IC).

Signal propagation delay time is the time it takes a pulse to pass through a logic element. Although delay time is usually fairly uniform among logic elements on the same IC, the delay time for all logic elements on an IC chip can vary with operating temperature. Propagation delay time can also vary substantially among elements on similar ICs due to differences in IC processing or design. Though circuit designers often seek to minimize propagation delay time, in some applications it is equally important that delay time be consistent and predictable despite variations in operating temperatures and IC process or design parameters.

In some logic systems, as for instance in many emitter-coupled logic element arrangements, propagation delay time is dependent, within limits, on bias signals applied to one or more transistors in the element. In the prior art, such bias signals were typically fixed and did not vary during operation of the logic element. In accordance with the present invention a means is provided to vary such bias signals during operation of a logic element such that propagation delay time of the element is held invariant for changes in operating temperature or differences in IC process parameters.

SUMMARY OF THE INVENTION

According to the present invention, a propagation delay controller, comprising an oscillator, e.g. a phase locked ring oscillator, and a bias signal generator, controls the propagation delay time ($T_{pd}$) of logic elements on an IC.

The phase locked ring oscillator is incorporated into the IC to be controlled and includes a number of representative logic elements on the IC. The logic elements are of a type wherein $T_{pd}$ is in part a function of an applied bias signal ($V_B$). The oscillator consists of a series of such logic elements, the output of each element being coupled to the input of the next. The output of the last element, the phase locking signal ($V_p$), is coupled back into the first in such a way that continuous oscillation takes place.

The bias signal generator compares $V_p$ with a known, reference signal ($V_{ref}$) and generates a bias signal $V_B$ proportional to the time integral of the phase difference between $V_p$ and $V_{ref}$. When a $V_p$ pulse leads a corresponding $V_{ref}$ pulse, $V_B$ decreases. When a $V_{ref}$ pulse leads the corresponding $V_p$ pulse, $V_B$ increases.

$V_B$ is applied to all of the logic elements in the ring oscillator and to all controlled logic elements on the IC. The oscillator and controlled logic elements operate such that an increase in $V_B$ causes a decrease in $T_{pd}$ while a decrease in $V_B$ causes an increase in $T_{pd}$. The frequency F of $V_p$ is equal to $1/(N \cdot T_{pd})$ where N is the number of elements, and therefore F will decrease while $V_p$ pulses lead $V_{ref}$ pulses and will increase while $V_{ref}$ pulses lead $V_p$ pulses. Consequently, F can be continuously and automatically forced to match the reference frequency, $F_{ref}$, of $V_{ref}$. Since the same bias signal is applied to all controlled logic elements, it follows that $T_{pd}$ for all controlled logic elements is continuously and automatically forced to $T_{pd} = 1/(N \cdot F_{ref})$ as long as $T_{pd}$ is within the operating range of the controlled elements. Use of the present invention has permitted control of propagation delay of ECL elements on the same or separate IC's to within 100 picoseconds of each other over a broad range of operating temperature.

It is therefore an object of the present invention to provide a circuit for generating a signal for adjusting the propagation delay of a logic element on an IC.

It is another object of the present invention to provide a circuit capable of controlling and matching the propagation delay of logic elements on separate IC's to within a close tolerance despite changes in temperature or IC process parameters.

The invention resides in the combination, construction, arrangement and disposition of the various component parts and elements incorporated in a digital IC propagation delay controller constructed in accordance with the principles of this invention. The present invention will be better understood and objects and important features other than those specifically enumerated above will become apparent when consideration is given to the following details and description, which when taken in conjunction with the annexed drawing describes, discloses, illustrates, and shows a preferred embodiment or modification of the present invention and what is presently considered and believed to be the best mode of practicing the principles thereof. Other embodiments or modifications may be suggested to those having the benefit of the teachings herein, and such other embodiments or modifications are intended to be reserved especially if they fall within the scope and spirit of the subjoined claims.

DETAILED DESCRIPTION OF THE PREFERRED EMBODIMENT

Figure 1:
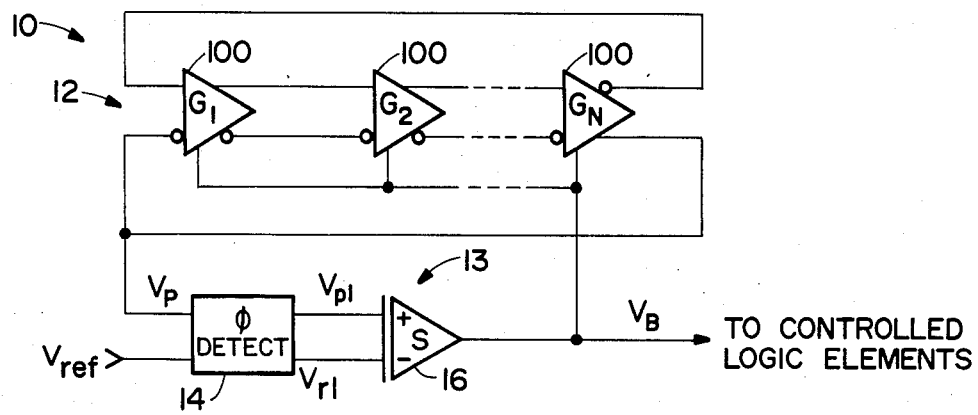
FIG. 1 is the block diagram of the preferred embodiment of the present invention.

FIG. 1 is a block diagram of the present invention, a digital integrated circuit (IC) propagation delay controller, generally noted by reference character 10. Controller 10 comprises an oscillator 12 (for example, a phase locked ring oscillator) and bias signal generator 13.

Oscillator 12 incorporates a number (N) of logic elements 100, designated G1 to GN, residing on an IC to be controlled. These logic elements have propagation delay characteristics typical of other logic elements on the IC. All logic elements are of a type in which propagation delay time is at least in part a function of applied bias voltage $V_B$.

Figure 2:
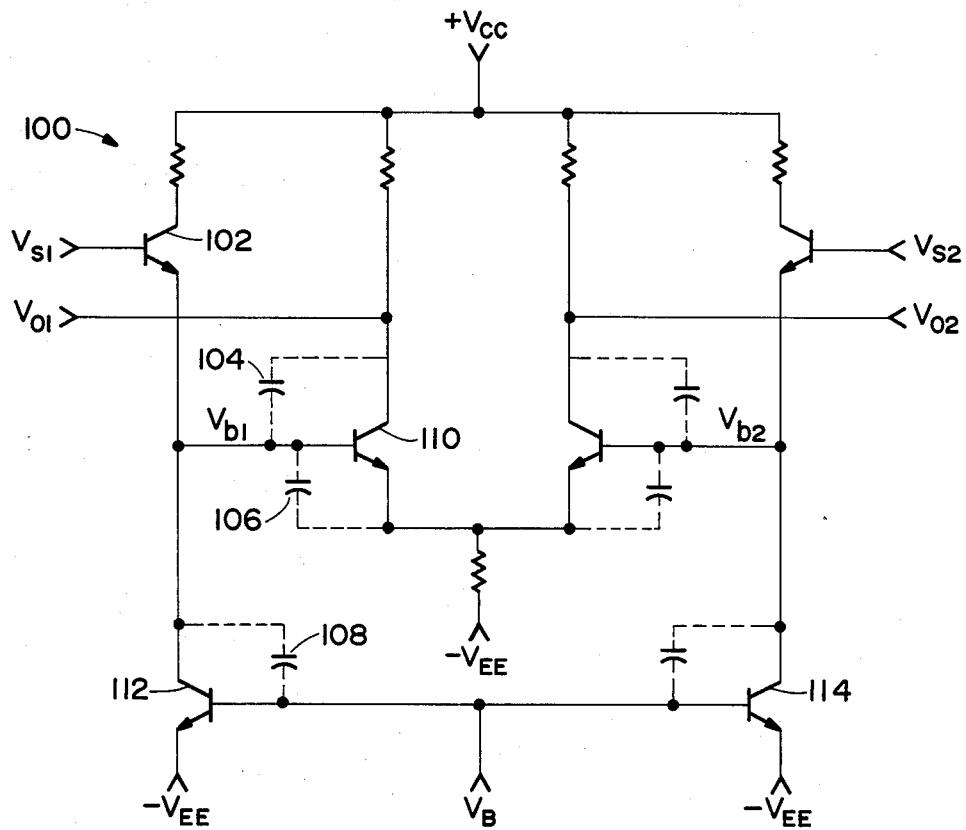
FIG. 2 is a schematic diagram of a typical logic element of the type having a propagation delay controllable by the present invention.

In the preferred embodiment, a typical such logic element is depicted in FIG. 2 as difference amplifier 100 having inverting and noninverting inputs $V_{s1}$ and $V_{s2}$ respectively and inverting and noninverting outputs $V_{o2}$ and $V_{o1}$ respectively. When a positive going pulse is applied to input $V_{s1}$, input emitter follower transistor 102 switches on and begins to charge parasitic capacitors 104, 106 and 108. After a time the voltage at the base of transistor 110 is sufficient to turn transistor 110 on. Inverting output $V_{o1}$ goes low and noninverting output $V_{o2}$ goes high. The rate of capacitor charging and discharging is proportional to the collector current flowing in transistor 112. If the bias signal $V_B$ on transistor 112 is high, the collector current of transistor 112 is high and the capacitor charging/discharging rate is high. If $V_B$ is low, transistor 112 collector current is low and capacitor charging/discharging rate is low.

Figure 3:
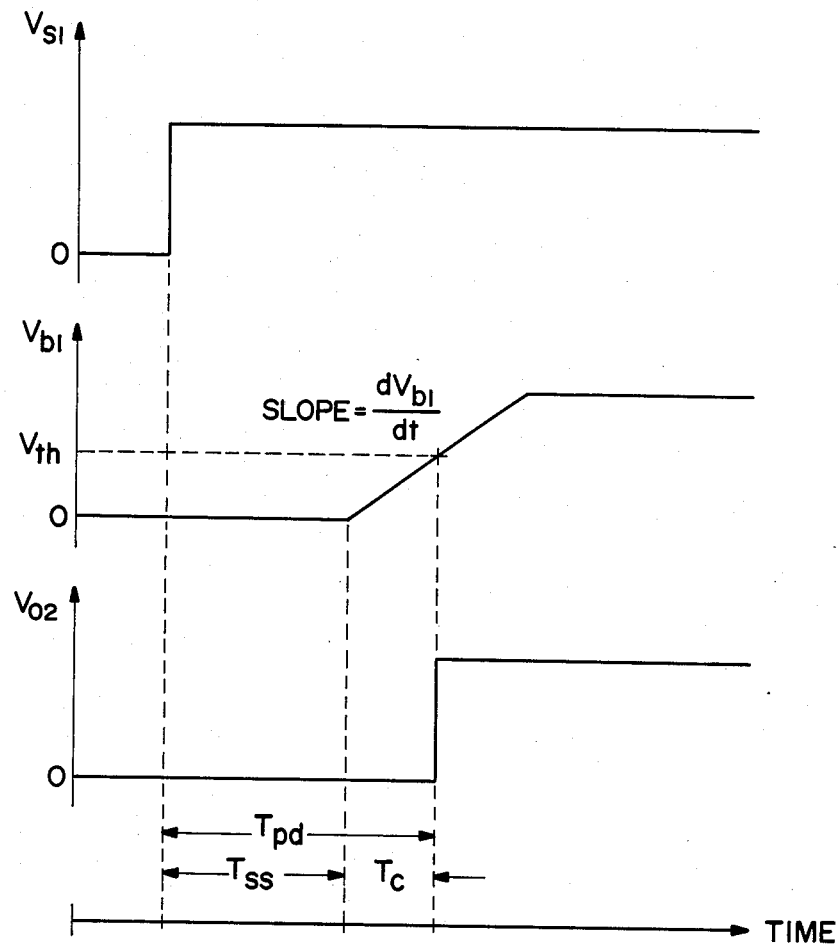
FIG. 3 is a graph illustrating the components of propagation delay time between input and output signals for a logic element of the type shown in FIG. 2.

Shown in FIG. 3 are plots of input voltage $V_{s1}$, transistor 110 base voltage $V_{b1}$, and output voltage $V_{o2}$ as functions of time. The propagation delay, $T_{pd}$, between leading edges of $V_{s1}$ and $V_{o2}$, is the sum of the small-signal delay time $T_{ss}$ and the capacitor charging time $T_c$. $T_{ss}$ is a function of the IC characteristics not affected by $V_B$. $T_c$ is the time it takes capacitors 104 and 106 to charge to the switching threshold voltage $V_{th}$ of transistor 110. It follows that $T_c = V_{th}/(dV_{b1}/dt)$ where $dV_{b1}/dt$ is the capacitor charging rate. Since $T_c$ is linearly dependent on capacitor charging rate, and since capacitor charging rate is dependent on $V_B$, $T_c$ may be controlled by varying $V_B$. Since $T_{pd} = T_{ss} + T_c$, then $T_{pd}$ is also dependent on $V_B$, $T_{ss}$ being relatively constant. Referring again to FIG. 2, propagation delay time for signals applied to the inverting input of difference amplifier 100 is controlled in a similar fashion by the $V_B$ signal on transistor 114.

In FIG. 1, oscillator 12 is constructed by connecting logic elements G1 through GN in a loop with the inverting and noninverting outputs coupled to the inverting and noninverting inputs of the next element respectively. However, the inverting and noninverting outputs of last element GN are coupled to the noninverting and inverting inputs of first element G1 respectively. In this arrangement, a pulse will continuously circulate through the loop. The circulating pulse is the phase locked signal, $V_p$, with oscillation taking place at a frequency dependent on the number of elements in oscillator 12 and their propagation delay times.

Bias signal generator 13, in the preferred embodiment, comprises phase detector 14 and integrator 16. Phase locking signal $V_p$ and a pulse reference signal ($V_{ref}$) are coupled to phase detector 14. Phase detector 14 is designed such that whenever the leading edges of a $V_p$ and a $V_{ref}$ pulse do not reach detector 14 simultaneously, phase detector 14 outputs a pulse. The duration of the output pulse is equal to the time difference between the leading edges of the $V_p$ and $V_{ref}$ pulses. The phase detector 14 output pulse occurs on either of two output terminals as signals $V_{p1}$ or $V_{r1}$ depending on whether $V_p$ leads or lags $V_{ref}$. If the leading edges of $V_p$ and $V_{ref}$ are synchronized, no pulse occurs on either of the phase detector 14 output terminals.

The $V_{p1}$ and $V_{r1}$ signals are coupled to the inverting and noninverting inputs of integrator 16. Integrator 16 is designed such that a $V_{p1}$ pulse will cause the output $V_B$ of integrator 16 to decrease by an amount proportional to the length of the $V_{p1}$ pulse. Conversely, a $V_{r1}$ pulse from the phase detector 14 will cause $V_B$ to increase by an amount proportional to the length of the $V_{r1}$ pulse.

Figure 4:
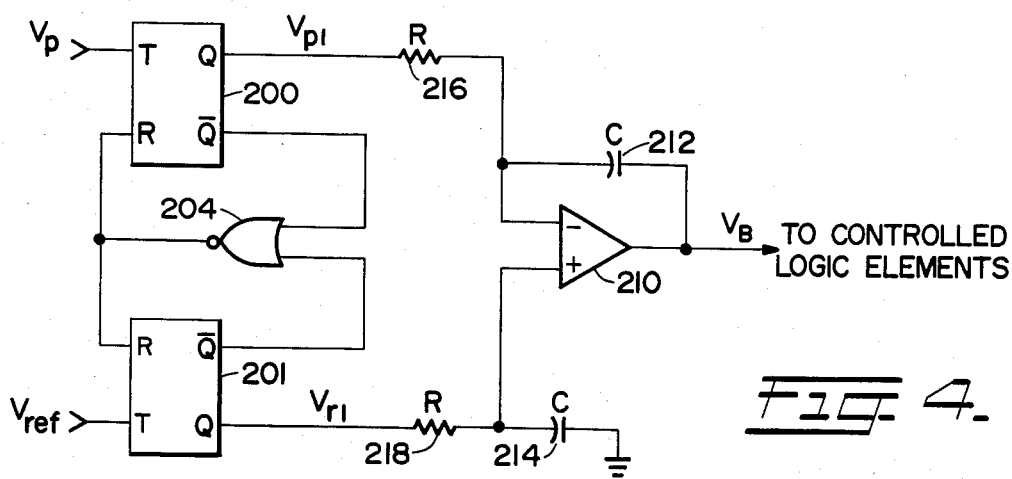
FIG. 4 is a block diagram detailing an embodiment of comparator and integrator portions of the circuit of FIG. 1.

FIG. 4 is a more detailed block diagram depicting the preferred embodiments of phase detector 14 and integrator 16. Phase detector 14 comprises "T" type flip-flops 200 and 201 and NOR gate 204 interconnected as shown. $V_p$ is applied to the T input of flip-flop 200 while $V_{ref}$ is applied to the T input of flip-flop 201. $V_{p1}$ and $V_{r1}$ appear at the Q terminals of flip-flops 200 and 201 respectively, and are applied to the negative and positive inputs of integrator 16.

Integrator 16 comprises operational amplifier 210, capacitors 212 and 214, and resistors 216 and 218 connected as shown. Capacitors 212 and 214 each have a capacitance C. Resistors 216 and 218 each have a resistance R. In this arrangement, the amplifier 210 output, $V_B$, is equal to the inverse of the time integral of $(V_{r1} - V_{p1})/RC$. Since the lengths of $V_{p1}$ and $V_{r1}$ are proportional to the phase difference between leading edges of $V_p$ and $V_{ref}$, $V_B$ is also proportional to the time integral of the phase difference between the oscillator and reference signals.

As shown FIGS. 1 and 2, $V_B$ is applied to logic elements through G1 through GN. $V_B$ is similarly applied to other elements on the IC. If $V_p$ leads $V_{ref}$, $V_B$ will decrease, decreasing $T_{pd}$. If $V_p$ lags $V_{ref}$, $V_B$ will increase, increasing $T_{pd}$. Thus $T_{pd}$ for each controlled element is held constant to a value adjustable by modifying the frequency of $V_{ref}$. Variation of $T_{pd}$ among controlled elements on the same IC is dependent only on variation in process parameters from element to element which is usually exceedingly small. Use of a larger number of elements in oscillator 12 insures that $V_B$ will be closer to the mean signal required by all elements. Use of a larger number of elements in oscillator 12 also decreases the frequency of the reference signal required to obtain a given $T_{pd}$.

While several embodiments of the present invention have been shown and described, it will be apparent to those skilled in the art that many other changes and modifications may be made without departing from the invention in its broader aspects. For instance, oscillator 12 may be formed in a variety of well-known ways using logic elements combined in circuits other than difference amplifier 100. Accordingly, the present invention may be practiced in conjunction with nearly any type of logic element in which propagation delay time varies with an applied bias signal. Also, phase detector 14 and integrator 16 may be constructed in a number of ways well known in the art. It is therefore intended that the appended claims cover all such changes and modifications as fall within the true spirit and scope of the present invention.

I claim:

1. A circuit for monitoring and controlling the propagation delay of logic elements on an integrated circuit comprising:

an oscillator having N logic elements of the integrated circuit connected in series to form a ring with the output of each logic element being connected to the input of the succeeding logic element such that a pulse continuously circulates around the ring, the oscillator logic elements having propagation delay characteristics typical of the other logic elements on the integrated circuit, the output of the oscillator being a phase locking signal having a frequency which is a function of the propagation delay of each logic element of the ring, the propagation delay of the logic elements being in part a function of applied bias voltage; and a bias signal generator, having as inputs the phase locking signal and a reference signal having a plurality of pulses of frequency Fref, for comparing the phase locking signal to the reference signal to generate a bias signal proportional to the time integral of the phase difference between the phase locking signal and the reference signal, the bias signal being applied to each logic element on the integrated circuit to automatically control the propagation delay of each logic element to be $1/(N \times Fref)$, the logic elements having similar propagation delay times for a given applied bias signal.

2. A circuit as in claim 1 wherein the oscillator logic elements comprise emitter-coupled logic difference amplifiers.

3. A circuit as in claim 1 wherein the bias signal generating means includes means for generating from the phase locking signal and the reference signal phase comparison pulses of length proportional to the phase difference between the phase locking signal and the reference signal.

4. A circuit as in claim 3 wherein the phase generating means comprises:

a first flip-flop coupled to set an output upon receiving each reference signal pulse;

a second flip-flop coupled to set an output upon receiving each phase locking signal pulse; and a logic gate coupled to compare and reset flip-flop outputs when both flip-flop outputs are set, the flip-flop outputs being the phase comparison pulses.

5. A circuit as in claim 4 wherein the bias signal generator further comprises:

a high gain amplifier for outputting the bias signal, the high gain amplifier having an inverting and a noninverting input resistively coupled to receive the phase comparison pulses from the respective flip-flops;

a first capacitor coupling the amplifier output and the inverting input; and a second capacitor coupling the noninverting input to a ground potential.

* * * * *